United States Patent [19]

Brown

[11] 4,319,190
[45] Mar. 9, 1982

[54] NUCLEAR MAGNETIC RESONANCE IMAGING IN SPACE AND FREQUENCY COORDINATES

[75] Inventor: Truman R. Brown, Bedminster, N.J.
[73] Assignee: Bell Telephone Laboratories, Incorporated, Murray Hill, N.J.
[21] Appl. No.: 127,726
[22] Filed: Mar. 6, 1980
[51] Int. Cl.³ ............................................. G01N 27/00
[52] U.S. Cl. .................................... 324/309; 324/313
[58] Field of Search ............... 324/300, 307, 309, 312, 324/313

[56] References Cited

U.S. PATENT DOCUMENTS 4,184,110  1/1980  Hinshaw ............................ 324/313

Primary Examiner—Michael J. Tokar
Attorney, Agent, or Firm—Peter A. Businger

[57] ABSTRACT

Imaging of 1-, 2-, or 3-dimensional specimens is effected based on nuclear magnetic resonance of a chemical species. A specimen is placed in an essentially constant magnetic field $H_o$, exposed to an electromagnetic pulse, and exposed to an an additional magnetic field $H_1$ whose strength is linearly increasing across the specimen. A free induction decay signal is sampled after field $H_1$ is turned off, and sample values are stored for later processing. These steps are carried out repeatedly for different fields $H_1$, and stored sample values are Fourier transformed into desired frequency spectra at points in the specimen.

10 Claims, 4 Drawing Figures

NUCLEAR MAGNETIC RESONANCE IMAGING IN SPACE AND FREQUENCY COORDINATES

TECHNICAL FIELD

The invention is concerned with nuclear magnetic resonance imaging.

BACKGROUND OF THE INVENTION

Well established as an analytic tool, especially in organic chemistry, is a technique known as nuclear magnetic resonance spectroscopy. This technique is based on interaction of the magnetic moment of nuclei in a specimen with radio frequency radiation while the specimen is exposed to a constant and spatially uniform polarizing magnetic field $H_o$. The technique involves observing a so-called free induction decay resonance signal, i.e., a radiofrequency signal which originates from a specimen upon stimulation with a radiofrequency pulse.

Usefulness of nuclear magnetic resonance spectroscopy as an analytic tool derives from a phenomenon known as chemical shift which is defined as the relative difference between the strength of an external magnetic field and the resulting field at a nucleus. Chemical shift is understood to be caused by a shielding or impeding influence of structure of electrons and nuclei surrounding a nucleus in an atom or molecule. For example, an unshielded proton absorbs radio frequency energy at a frequency of 60 Megahertz when it experiences a magnetic field strength of 14,092 gauss. Depending on structure surrounding a proton, however, 60 Megahertz radiation is absorbed at a different, slightly higher magnetic field strength. Conversely, in an applied magnetic field of 14,092 gauss, radiation is absorbed at a frequency slightly lower than 60 Megahertz. Since shielding influence may characterize a chemical species, chemical shift may be interpreted in terms of the presence of chemical elements and compounds in a specimen.

Expositions of principles, methods, and applications of nuclear magnetic resonance can be found in books by J. A. Pople et al., *High-resolution Nuclear Magnetic Resonance*, McGraw-Hill, 1959, and by F. A. Bovey, *Nuclear Magnetic Resonance Spectroscopy*, Academic Press, 1969; the latter reference, on p. 31, discloses electromagnetic coils known as "shims" which serve to compensate for nonuniformity in the field $H_o$. Shims are also disclosed by V. B. Nazarov et al., "Compensators for nonuniformity of the magnetic field of a superconducting solenoid", *Cryogenics*, Dec. 1972, pp. 470-471. Catalogs of chemical shifts are available to facilitate chemical analysis by nuclear magnetic resonance spectroscopy.

Utilization of nuclear magnetic resonance has been proposed more recently for imaging, i.e., for obtaining information of concentration of a nuclear species at points in a specimen. According to a proposal by P. C. Lauterbur, "Image Formation by Induced Local Interactions: Examples Employing Nuclear Magnetic Resonance", *Nature*, Vol. 242, Mar. 16, 1973, pp. 190-191, an additional magnetic field is used which has the same direction as $H_o$, but whose strength has nonzero gradient. Projections of three-dimensional nuclear spin density onto lines are obtained from which an image can be constructed. Variants of this method are disclosed in U.S. Pat. No. 4,070,611, issued Jan. 24, 1978 to R. R. Ernst and in the papers by A. Kumar et al., "NMR Fourier Zeugmatography", *Journal of Magnetic Resonance* 18, (1975), pp. 69-83, by W. S. Hinshaw, "Image formation by nuclear magnetic resonance: The sensitive point method", *Journal of Applied Physics*, Vol. 47, No. 8, Aug. 1976, pp. 3709-3721, and by D. I. Hoult, "Rotating Frame Zeugmatography", *Journal of Magnetic Resonance* 33, (1979), pp. 183-197. Surveys of nuclear magnetic resonance imaging methods are presented by P. Mansfield et al., "Biological and Medical Imaging by NMR", *Journal of Magnetic Resonance* 29, pp. 355-373 (1978) and by P. Brunner et al., "Sensitivity and Performance Time in NMR Imaging", *Journal of Magnetic Resonance* 33, pp. 83-106 (1979). The latter reference particularly provides a comparison of methods with respect to signal-to-noise ratio and time required to obtain an image.

An imaging method may be classified depending on whether or not it involves application of a Fourier transform. For example, the sensitive point method disclosed in the above-cited paper by Hinshaw produces an image directly; on the other hand, U.S. Pat. No. 4,070,611 discloses a method involving application of a discrete Fourier transform to measured data signals. Such transform may be in one or several variables as discussed, e.g., in the book by R. N. Bracewall, *The Fourier Transform and Its Applications*, McGraw-Hill, 1978. Computer programs for performing discrete Fourier transforms by a so-called FFT algorithm are disclosed in the book by P. Bloomfield, *Fourier Analysis of Time Series: An Introduction, Series: An Introduction*, Wiley, 1976.

While methods proposed and surveyed in the papers cited above differ among each other as to speed and signal-to-noise ratio, such methods are limited alike to the observation of a single chemical shift or frequency in a three-dimensional specimen. Such limitation is not serious when a desired image is desired based on a nuclear species having a single resonance frequency; however, to produce an image corresponding to a species having multiple resonance frequencies, a method is desired for imaging over a frequency interval.

SUMMARY OF THE INVENTION

Imaging of at least one of a chemical species associated with an atomic nucleus in a 1-, 2-, or 3-dimensional specimen is effected by detecting an electromagnetic signal emitted by the specimen in an essentially constant, spatially uniform magnetic field upon stimulation by an electromagnetic pulse. An additional magnetic field is superimposed on the essentially constant magnetic field; the additional field has essentially the same direction as the essentially constant field but its strength is linearly increasing across the specimen. For detection, the additional field is turned off. A sequence of measurements is carried out using additional fields having gradients corresponding to different points in Fourier transform space. A desired image is obtained by applying a Fourier transform to collected measured values.

Detailed Description

Figure 1:
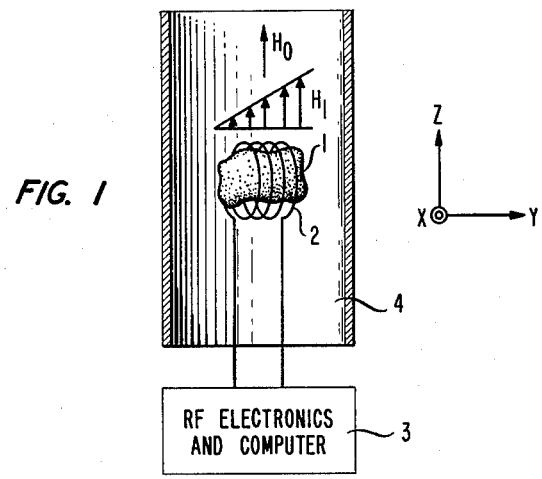
FIG. 1 schematically shows essential components of a nuclear magnetic resonance imaging device as may be used to practice the invention.

Imaging according to the invention may be carried out by means of apparatus whose essential components are schematically shown in FIG. 1. Specifically, FIG. 1 shows specimen 1 inside coil 2 which is connected to radiofrequency electronics and computer 3. Essentially constant magnetic field $H_o$ is produced by coil 4 which is understood to further comprise means for additionally producing a magnetic field $H_1$ which has direction z and whose strength can be made to increase linearly in desired directions. Such means may take the form of so-called "shims" in directions x, y, and z, as described and depicted, e.g., on p. 31 of Bovey's book or on p. 470 of Nazarov's paper cited above. Details of circuitry for controlling field $H_1$ are disclosed in the above-cited U.S. Pat. No. 4,070,611.

Practice of the method involves placing specimen 1 inside coil 2, applying magnetic field $H_o$, and repeatedly carrying out sequential steps of: (1) sending an electromagnetic pulse via coil 2, (2) applying additional magnetic field $H_1$ having gradient G, and (3) sensing a free induction decay signal by means of coil 2.

Figure 2:
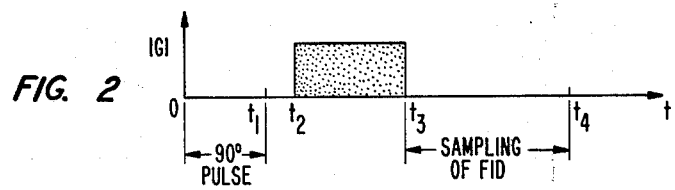
FIG. 2 is a diagram of magnitude of a magnetic field gradient as a function of time according to a preferred embodiment of the invention.

Practice of steps (1)–(3) is illustrated further by FIG. 2 which is a diagram of the strength of gradient G as a function of time. Step (1) of sending an electromagnetic pulse is shown to initiate at time zero and to last until time $t_1$ which is typically of the order of microseconds. Step (2) of applying magnetic field $H_1$ is shown to start at time $t_2$ which is preferably close to $t_1$ and which may typically be equal to $t_1$; field $H_1$ is turned off at time $t_3$ which is typically of the order of milliseconds. Gradient G of magnetic field $H_1$ is related to a point k in the space of Fourier transforms of spatial coordinates of sample space according to the relationship $$k = -\gamma \int_{t_2}^{t_3} G(\tau) d\tau,$$

where denotes the gyromagnetic ratio of the nuclear species under observation. Gradient G may be time varying according to any desired schedule such as, e.g., by sequential steps in directions x, y, and z; alternatively, G may be constant such that $k = -\gamma G (t_3 - t_2)$.

Free induction decay is sampled in a time interval from $t_3$ to $t_4$, sample values being stored for later processing. Time $t_4$ is typically chosen to correspond to a point at which a free induction decay signal becomes indistinguishable from background noise. Sampling is typically at times spaced equally by a time interval $\Delta t$ which is chosen sufficiently short to satisfy the sampling theorem (Nyquist's theorem), i.e., to allow for coverage of a desired chemical shift spread without "aliasing".

Stimulation by a radiofrequency signal, application of field $H_1$, and sampling of free induction decay may be carried out sequentially as described above; alternatively, such steps may overlap at least in part. What is required, however, is that sampling of free induction decay continue beyond a time at which gradient G is turned off.

Figure 3:
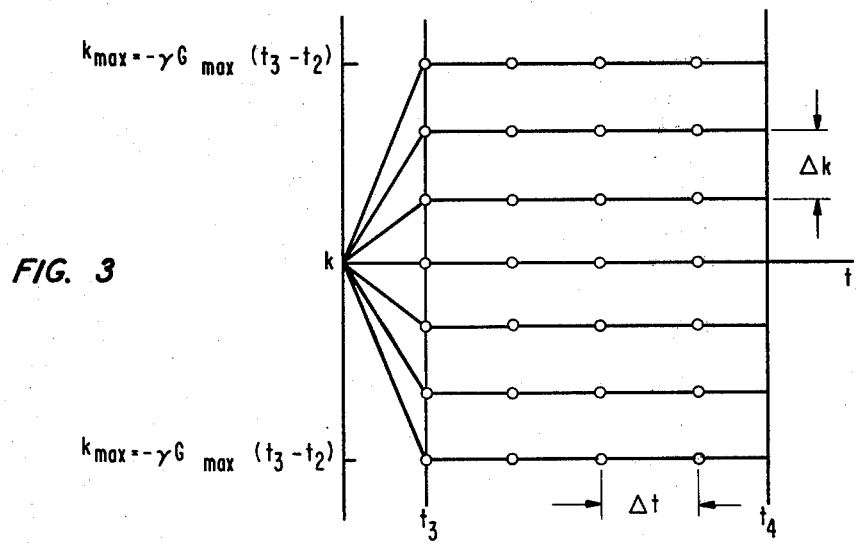
FIG. 3 is a diagram of a coordinate k versus a time coordinate t, both in the space of Fourier transforms of the space of spatial and chemical shift coordinates.

FIG. 3 shows sample points (k, t) in Fourier space. Sampling is shown equally spaced in coordinates t and k. The coordinate t represents time; the coordinate k represents a 1-, 2-, or 3-dimensional vector. To allow for coverage of an entire specimen, distance $\Delta k$ is chosen sufficiently small and, to provide for adequate resolution in sample space, an extreme point $k_{max} = -\gamma G_{max} (t_3-t_2)$ is chosen sufficiently large.

Once free induction decay measurements have been made for a sufficient number of points k, stored sample values are transformed by discrete Fourier transform, resulting in a filtered image of chemical shift spectra at points in sample space. A purely spatial image may be formed at this point, e.g., by integrating the frequency spectrum at each spatial point or by selecting intensity corresponding to a specific frequency.

Quality of a filtered image depends largely on parameters such as sampling rate and spacing of sample points, higher rates and closer spacing yielding higher resolution in frequency and spatial coordinates. If selective enhancement of spatial features is desired, it is further possible to deviate from equidistant sampling in the interest, e.g., of enhancing high- or low-frequency components in an image. In particular, high-frequency components are enhanced when sample points are more closely spaced near extreme points $+k_{max}$ and $-k_{max}$; conversely, more closely spaced sampling near $k=0$ leads to enhancement of low frequencies.

An additional variation of the method allows for imaging of a periodically moving object by carrying out free induction decay measurements synchronously with the movement of the object. For example, a still image may be obtained in this fashion of a beating heart.

Images obtained by the disclosed method are considered to have optimal or near-optimal signal-to-noise ratio.

EXAMPLE 1.

A cylindrical sample having a length of 20 cm and a diameter of 10 cm is imaged according to the invention with a spatial resolution of at least 1 cm. Such resolution is achieved by reconstructing an image at points spaced 1 cm apart in directions x, y, and z; consequently, free induction decay measurements at 2000 points in k-space are sufficient to cover the sample. If 10 hertz resolution in frequency is sufficient, less than 5 minutes is required to carry out these measurements.

A purely spatial image is formed by selecting an intensity corresponding to a specific compound such as, e.g., inorganic phosphate, adenosine triphosphate, creatine phosphate.

EXAMPLE 2.

Figure 4:
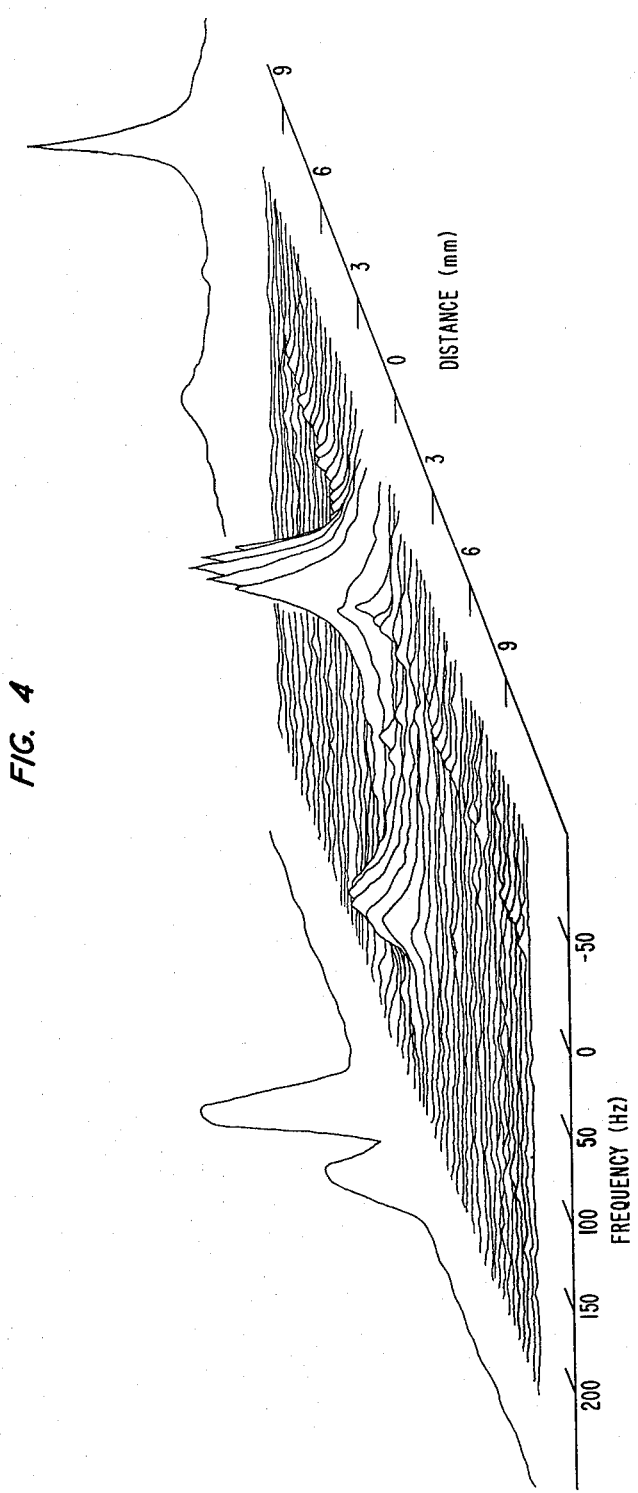
FIG. 4 is a representation of intensity (representing concentration of a nuclear species) versus a frequency coordinate and a single spatial coordinate and constitutes an image obtained according to the invention.

A test sample was prepared by filling a glass tube having an interior diameter of 1.5 mm with a solution of phosphoric acid. An identical tube was filled with a solution of fructose-6-phosphate. A specimen consisting of the two solution volumes, separated by a distance of 2.5 mm, was imaged according to the invention using $^{31}P$ at 145 megahertz in one space coordinate and a frequency coordinate. A graphical representation of the image is shown in FIG. 4 which shows intensity as a function of frequency and distance. The origins of frequency and distance coordinates correspond, respectively, to the frequency of $^{31}P$ nuclei in phosphoric acid and to the midpoint between the solution volumes.

It can be seen from FIG. 4 that the two solution volumes are distinguished in the image as to position as well as to chemical shift. FIG. 4 also shows curves which are obtained, respectively, by integrating over frequency and over distance.

I claim:

1. Method for producing an image of at least a first species and a second species of nuclear spin in at least a portion of a specimen, said image comprising information of concentration of said species at points in said specimen, said method comprising subjecting said portion to an essentially constant first magnetic field ($H_o$) whose direction is here designated as the z-direction, repeatedly carrying out the steps of (1) subjecting said portion to a first electromagnetic signal which is a radiofrequency pulse, (2) subjecting said portion to a second magnetic field ($H_1$) which is essentially in said z-direction, whose strength is essentially linearly increasing in a spatial direction which is substantially different from said z-direction, and whose gradient is specifically chosen for each repetition, and (3) sampling a second electromagnetic signal which originates from said portion, and applying a discrete Fourier transform to values obtained in the course of sampling, said method being CHARACTERIZED IN THAT sampling is carried out at least in part while said gradient is essentially equal to zero whereby one coordinate of said image at least in part represents chemical shift of said species in said specimen.

2. Method of claim 1 in which step (2) is carried out upon or after termination of step (1).

3. Method of claim 1 in which step (3) is carried out upon or after termination of step (2).

4. Method of claim 1 in which sampling said second electromagnetic signal is at times which are equally spaced in time.

5. Method of claim 1 in which, for each repetition, said gradient is chosen to be a member of a collection of points having coordinates which are an integral multiple of an interval.

6. Method of claim 1 comprising an additional step of obtaining a purely spatial image.

7. Method of claim 6 in which said additional step consists in selecting concentration information at a desired frequency.

8. Method of claim 6 in which said additional step consists in integrating concentration information over frequency.

9. Method of claim 1 in which repeated choice of said gradient is such that at least one desired spatial frequency component of said image is enhanced.

10. Method of claim 1 in which at least a part of said specimen is moving periodically and in which repeatedly carrying out said steps is essentially synchronous with the movement of said part.

* * * * *